United States Patent [19]
Sato et al.

[11] Patent Number: 5,514,989
[45] Date of Patent: May 7, 1996

[54] SEMICONDUCTOR LIGHT EMITTING ELEMENT DRIVER CIRCUIT

[75] Inventors: Toshiaki Sato, Yamato; Toshihiko Ichise; Keiji Ishizuka, both of Kawasaki; Shunichi Morita; Shunichi Kaizu, both of Atsugi, all of Japan

[73] Assignee: Canon Kabushiki Kaisha, Tokyo, Japan

[21] Appl. No.: 170,753

[22] Filed: Dec. 21, 1993

[30] Foreign Application Priority Data

Dec. 25, 1992 [JP] Japan ................... 4-357742

[51] Int. Cl.$^6$ ............... H03K 19/082; H03K 19/094
[52] U.S. Cl. ................ 327/109; 327/432; 327/575; 327/514
[58] Field of Search ................ 327/108, 109, 327/514, 504, 77, 78, 432, 540, 541, 490, 483, 575, 374, 376; 330/288, 257

[56] References Cited

U.S. PATENT DOCUMENTS

| | | | |
|---|---|---|---|
| 4,121,122 | 10/1978 | Pokrandt | 307/362 |
| 4,221,979 | 9/1980 | Ahmed | 307/255 |
| 4,295,226 | 10/1981 | Dombrowski | 455/618 |
| 4,445,054 | 4/1984 | Ishii | 307/555 |
| 4,544,878 | 10/1985 | Beale et al. | 323/315 |
| 4,549,095 | 10/1985 | Stefani et al. | 307/254 |
| 4,634,902 | 1/1987 | Tanaka et al. | 307/542 |
| 4,812,907 | 3/1989 | Hathaway et al. | 358/153 |
| 4,916,307 | 4/1990 | Nishibe et al. | 250/214 C |
| 5,061,861 | 10/1991 | Sameshima et al. | 327/109 |
| 5,117,099 | 5/1992 | Schmidt | 250/208.2 |
| 5,130,923 | 7/1992 | Warriner et al. | 365/240 |
| 5,212,456 | 5/1993 | Kovalcik et al. | 330/257 |

FOREIGN PATENT DOCUMENTS

| | | |
|---|---|---|
| 0040045 | 11/1991 | European Pat. Off. . |
| 2594544 | 8/1987 | France . |
| 3705915 | 9/1988 | Germany . |
| 2241095 | 8/1991 | United Kingdom . |

OTHER PUBLICATIONS

Patent Abstracts of Japan, vol. 6, No. 145 (p–132) (1023) 4 Aug. 1982 & JP–A–57 066 324 (Sharp. K.K.).
Patent Abstracts of Japan, vol. 9, No. 288 (E–358) (2011), Nov. 15, 1985 & JP–A–60 128 711 (Fujitsu K.K.), Jul. 9, 1985 (Abstract).

*Primary Examiner*—Timothy P. Callahan
*Assistant Examiner*—My-Trang Nu Ton
*Attorney, Agent, or Firm*—Fitzpatrick, Cella, Harper & Scinto

[57] ABSTRACT

A driver circuit comprises a current mirror circuit including an output transistor, a load connected to a main electrode of the output transistor, and current supplying device for supplying a current to a control electrode of the output transistor. The output transistor controls a current flowing through the load.

11 Claims, 16 Drawing Sheets a: ADDRESS   b: ROM OUTPUT

FIG. 13
PRIOR ART
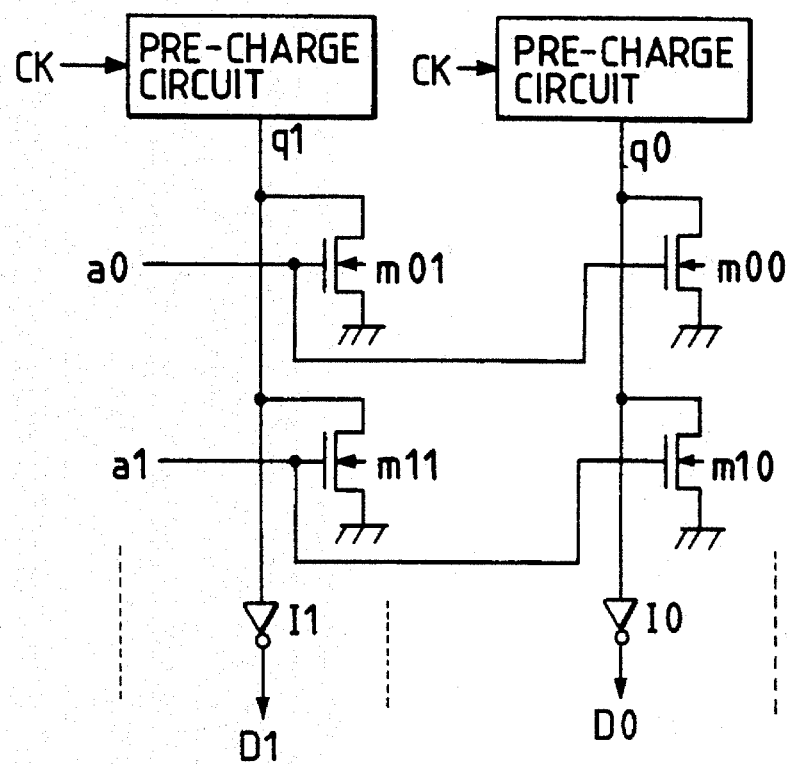
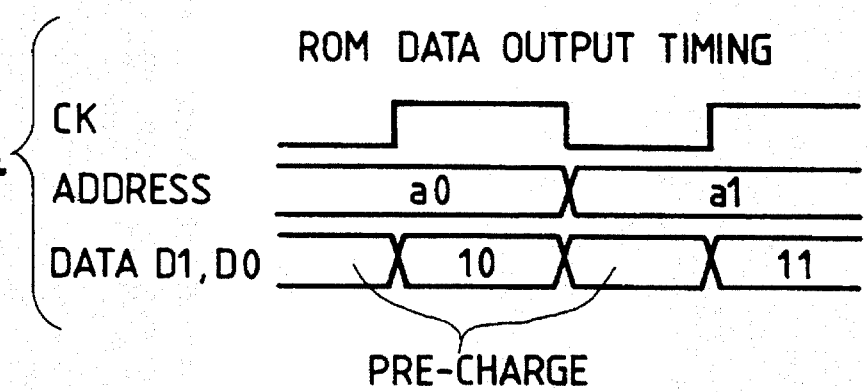
FIG. 14
PRIOR ART

SEMICONDUCTOR LIGHT EMITTING ELEMENT DRIVER CIRCUIT

BACKGROUND OF THE INVENTION

1. Field of the Invention

The present invention relates to a driver circuit, and more particularly, to a driver circuit that can switch a load such as a semiconductor light emitting element at high speed. Furthermore, the present invention can be systematized with a photoelectric converter device and a memory device.

2. Related Background Art

An explanation will be made below as for a prior art driver circuit and a prior art semiconductor light emitting element driver circuit.

FIG. 1 is a circuit diagram showing an example of conventional driver circuits and more specifically a semiconductor light emitting element driver circuit. Referring to FIG. 1, the laser diode 50 has a cathode connected to a lower potential (GND) and an anode connected to the output of a current mirror circuit. The current mirror circuit is formed of NPN transistors 19 and 20. An active element 40 is connected between the input of the current mirror circuit and the lower potential to switch on or off a laser diode. A current mirror circuit, which is formed of MOS transistors 38 and 39, is connected between the input of the above current mirror circuit and a higher potential ($V_{CC}$).

Next, an operation of the driver circuit will be explained below.

Assuming that an input current $I_0$ is needed to emit the laser element at a laser output $P_0$; the input current of the current mirror circuit formed of transistors 19 and 20 is $I_1$; and the current mirror ratio is 1/n, when the switching active element 40 is turned off, a current $nI_1$ flows through the laser diode 50. If $nI_1=I_0$, the laser diode 50 emits with an output of $P_0$. When the switching active element 40 is turned on, it sinks a current $I_1$, thus causing no current flowing through the laser diode 50. At the end, the light emitting diode 50 ceases its light emitting. Therefore, the driver circuit shown in FIG. 1 allows the laser diode 50 to perform its switching operation in response to a control signal to the switching active element 40.

However, in the conventional driver circuit, there is a disadvantage in that the large capacitance being parasitic on the current mirror circuit disturbs the switching operation at high speed of the laser diode 50.

Moreover, there is a disadvantage in that when the conventional driver circuit is operated on a power source voltage of 5 volts while the voltage $V_L$ across the load is, for example, 1.5 to 2.5 volts, the current mirror circuit formed of PMOS transistors 38 and 39 cannot hold a sufficient operational margin because of the voltage $V_L$ and the base to emitter voltage of the NPN transistors 19 and 20.

SUMMARY OF THE INVENTION

In order to overcome the above mentioned various problems, an object of the present invention is to provide a driver circuit that can switch a load such as a semiconductor light emitting element at high speed and can provide sufficient operational margin.

Another object of the present invention is to provide a semiconductor light emitting element driver circuit that can switch a load such as a semiconductor light emitting element at high speed and can provide sufficient operational margin.

In order to achieve the objects, a driver circuit according to the present invention is characterized by a current mirror circuit including an output transistor; a load connected to a main electrode of the output transistor; and current supplying means for supplying a current to a control electrode of the output transistor; whereby the output transistor controls a current flowing through the load.

The semiconductor light emitting driver circuit according to the present invention uses the above driver circuit and is characterized by a current mirror circuit including an output transistor; a semiconductor light emitting element connected to a main electrode of said output transistor; and current supplying means for supplying a current to a control electrode of the output transistor; whereby the output transistor controls a current flowing through the semiconductor light emitting element.

BRIEF DESCRIPTION OF THE DRAWINGS

FIG. 13 is a circuit diagram of a conventional ROM;

FIG. 14 is a timing chart explaining an operation of the ROM shown in FIG. 13;

DETAILED DESCRIPTION OF THE PREFERRED EMBODIMENTS

The driver circuit according to the present invention includes current supplying means which drives the control electrode of an output transistor in a current mirror circuit when the current mirror circuit provides an ON output in response to a control signal, thus enabling a switching operation of a load at high speed.

The semiconductor light emitting element driver circuit according to the present invention is constituted of the above driver circuit which is used to drive a semiconductor light emitting element such as a laser diode and a light emitting diode.

With reference to the attached drawings, an explanation will be made below on embodiments of the present invention.

Figure 1:
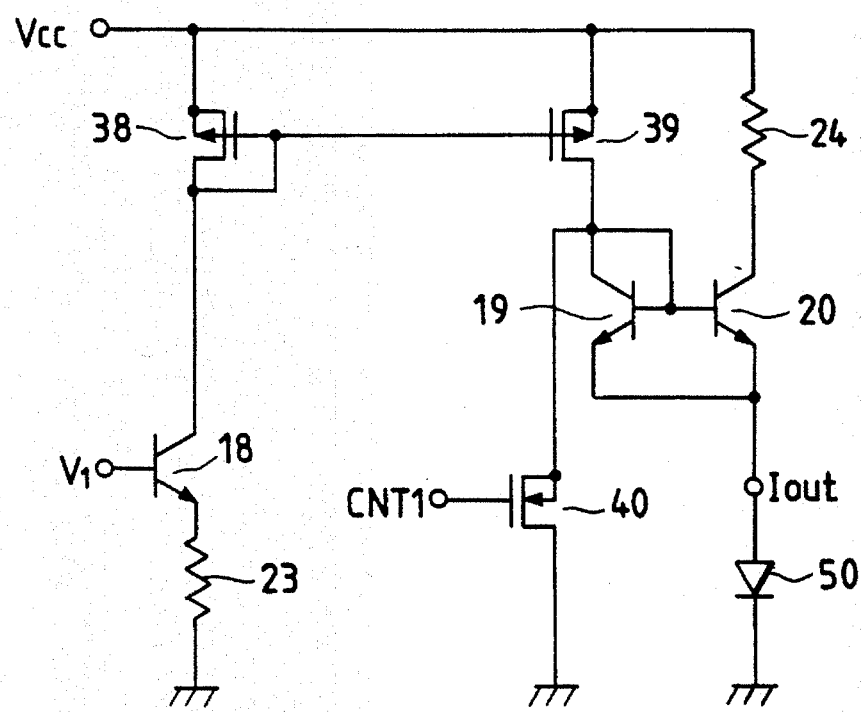
FIG. 1 is a circuit diagram showing an embodiment of a conventional driver circuit.
Figure 2:
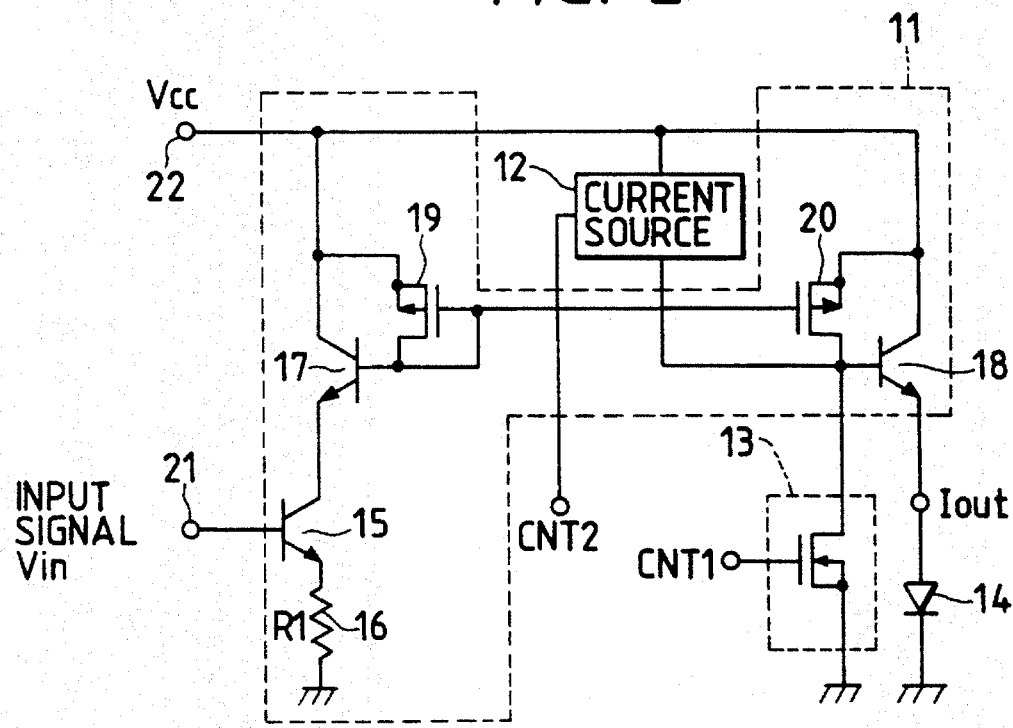
FIG. 2 is a circuit diagram explaining the principle of a driver circuit according to the present invention.

FIG. 2 is a circuit diagram explaining the principle of the driver circuit according to the present invention. Referring to FIG. 2, numeral 11 represents a current mirror circuit, 12 a current source being current supplying means, 13 an NMOS transistor, 14 a laser diode, 15 and 17 respectively an NPN transistor, 18 an NPN transistor acting as an output transistor in the current mirror circuit, 16 a resistor ($R_1$), 19 and 20 respectively a PMOS transistor, and 21 and 22 a terminal for receiving an input voltage $V_{in}$ and a terminal for receiving a drive voltage $V_{CC}$, respectively. CNT1 represents an input terminal for receiving a control signal which performs an on/off control of output current and CNT2 represents an input terminal for driving the control electrode or base of the output transistor 18 in the current mirror circuit 11. The output transistor 18 has an emitter acting as one main electrode connected to the laser diode 14.

In FIG. 2, it is assumed that when an input voltage $V_{in}$ is applied to the terminal 21, the collector current of the NPN transistor 15 is an internal reference current $I_{ref}$. When the voltage between the base and the emitter of the NPN transistor 15 is $V_{BE}$ and the resistance value of the resistor 16 is $R_1$, the current $I_{ref}$ is expressed by the following formula:

$$I_{ref}=(V_{in}-V_{BE})/R_1 \qquad (3)$$

Figure 3:
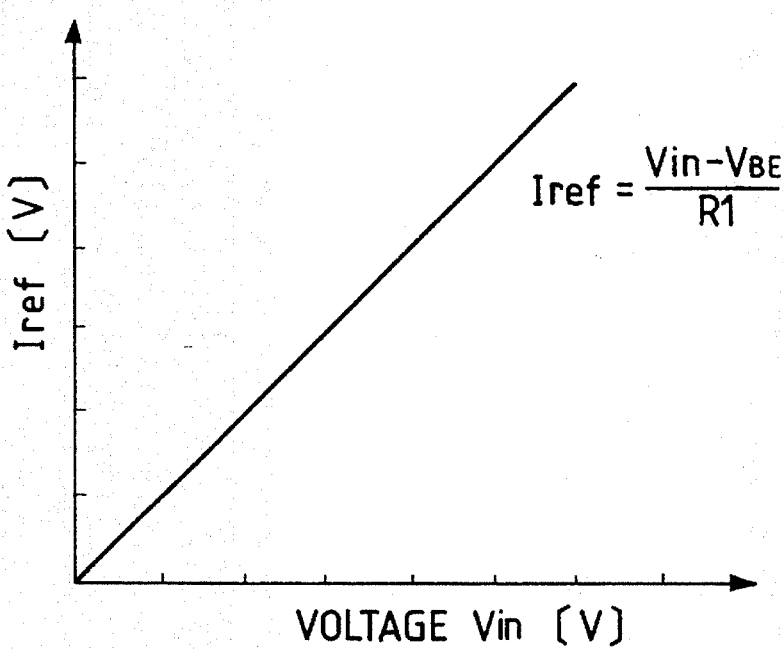
FIG. 3 is a characteristic diagram showing the relationship between applied input voltage and internal reference current shown in FIG. 2.

The relationship according to the formula (3) is shown in FIG. 3. It is assumed that the gate length ratio between the PMOS transistors 19 and 20 is 1/n and the PMOS transistor 19 has a gate length equal to that of the PMOS transistor 20. When the emitter area ratio between the NPN transistors 17 and 18 is 1/m, and the current amplification factors ($h_{FE}$) of the NPN transistors 17 and 18 are β, the base current $I_{B1}$ of the NPN transistor 17 is expressed by the following formula (4):

$$I_{B1}=I_{ref}/(1+\beta) \qquad (4)$$

Since the PMOS transistors 19 and 20 have respectively the gate connected to the same potential and the source connected to a higher potential, the source to drain voltages of the PMOS transistors 19 and 20 are equal to each other. The gate length ratio between the PMOS transistors 19 and 20 is 1/n. The drain current of the PMOS transistor 20 is equal to the base current of the NPN transistor 18. The base current $I_{B2}$ is expressed by the following formula (5):

$$I_{B2}=nI_{B1}=nI_{ref}/(1+\beta) \qquad (5)$$

The emitter area ratio between the NPN transistors 17 and 18 is 1/m (where m=n). Hence when the collector current of the NPN transistor 18 is $I_{C2}$, the output current $I_{out}$ of the drive circuit is expressed by the following formula (6) obtained by transforming the above formula (5):

$$I_{out}=I_{B2}+I_{C2}=(1+\beta)nI_{B1}=nI_{ref} \qquad (6)$$

Figure 4:
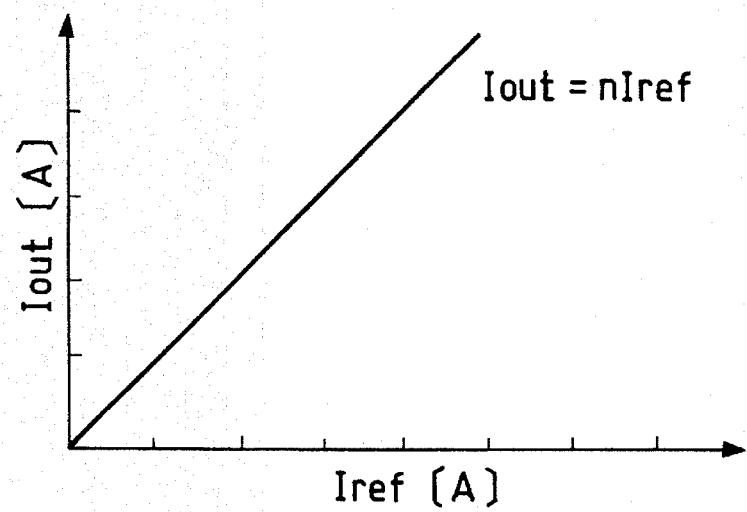
FIG. 4 is a characteristic diagram showing the relationship between internal reference current and output current shown in FIG. 2.

The relationship of the formula (6) is graphed in FIG. 4.

Figure 5:
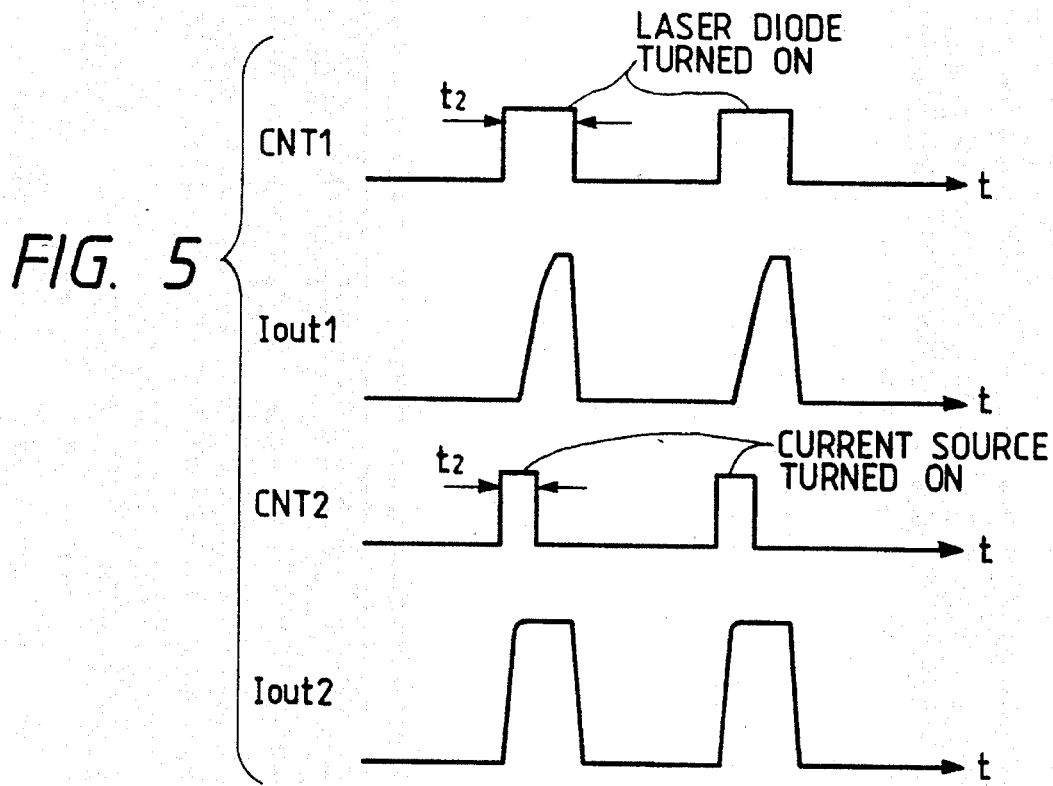
FIG. 5 is a timing chart explaining the transient characteristics of output current from the driver circuit to show the effect of the current supplying means (current source)

FIG. 5 is a timing chart showing a transient characteristic expressing an operation of the driver circuit according to the present invention.

Referring to FIG. 2, with a voltage $V_{in}$ applied to the input terminal 21 and the current source 12 in off state (corresponding to no current source 12), when an output current control signal is applied to the terminal CNT1, an output current $I_{out1}$ flows. In FIG. 5, the waveform shown with CNT1 shows the timing that the laser diode 14 is turned on. The waveform shown with $I_{out1}$ shows a current flowing through the laser diode 14. The parasitic capacitance of the transistor forming the current mirror circuit shown in FIG. 2 causes a time reaching a stable state.

Next, when a control signal is applied to the terminal CNT2 of the current source 12, in synchronous state with the output current control signal applied to the terminal CNT1, an output current $I_{out}2$ flows. In FIG. 5, the waveform shown with CNT2 shows the timing that the current source 12 is turned on. The waveform shown with $I_{out2}$ shows a current flowing through the laser diode 14. Overdriving the base of the output transistor 18 in the current mirror circuit using the current source 12 causes an output current of $I_{out2}$, thus making a stable state in shorter time than that of the output current $I_{out1}$ in the conventional current mirror circuit.

When a control signal is applied to the terminal CNT2 of the current source 12, the current source 12 operates only at an output current rising time so that the pulse width $t_2$ of a control signal to the terminal CNT2 is shorter than the pulse width $t_1$ of a control signal to the terminal CNT1. Hence it is possible to minimize the current consumed by the current source 12.

The driver circuit according to the present invention used for a semiconductor light emitting element will be explained below. However it is apparent that the driver circuit of the present invention should not be restricted to only the following specific use.

Figure 6:
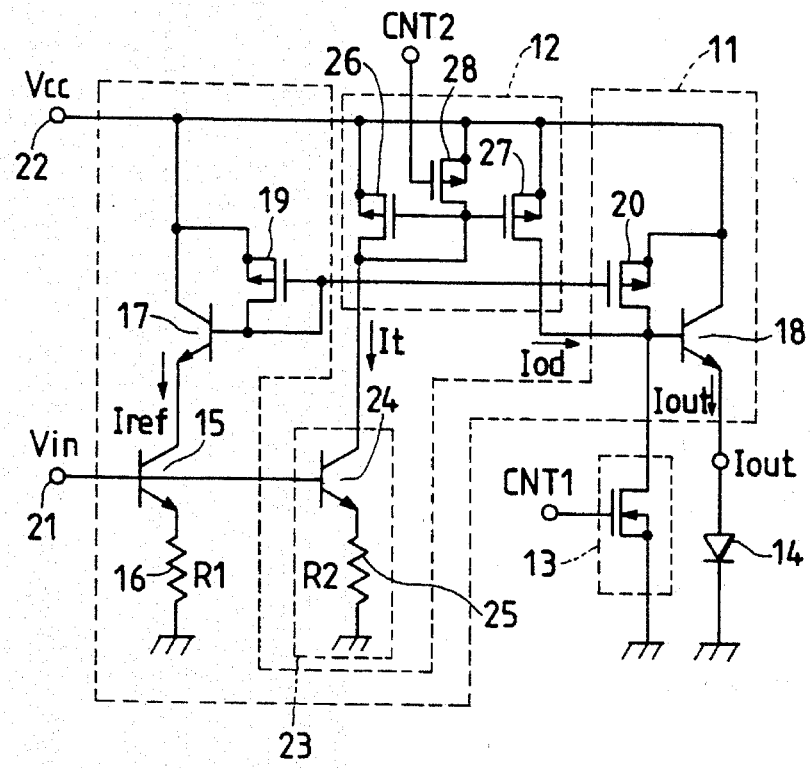
FIG. 6 is a circuit diagram showing an embodiment of a driver circuit according to the present invention.

FIG. 6 is a circuit diagram showing an embodiment of the driver circuit of the present invention. Like numerals are attached to the elements similar to those shown in FIG. 2.

As shown in FIG. 6, the current source 12 is formed of PMOS transistors 26 to 28. The PMOS transistor 28, which is used to perform an on/off control of the current source 12, may be replaced by a transmission gate.

The current source 12 shown in FIG. 6 rises the output current to a stable state in a short time by turning on and off the control signal added to the terminal CNT2 of the current source 12 synchronously with an output current control signal applied to the terminal CNT1. As a result, the driver circuit allows a load such as a semiconductor light emitting element to perform a switching operation at high speed. Since the current source 12 operates at only the output current rising time, the width of a pulse to the terminal CNT2 is smaller than that to the terminal CNT1, whereby the consumed current in the current source 12 can be minimized.

The current mirror circuit, which is formed of NPN transistors 17 and 18 and PMOS transistors 19 and 20 shown in FIG. 6, can maintain its operational margin, in comparison with to the insufficient margin of the conventional circuit.

As described above, the input voltage $V_{in}$ of the driver circuit, and the collector current (internal reference current) $I_{ref}$ and the output current $I_{out}$ of the NPN transistor 15 represent the relationships expressed by the formulas (3) and (6) and shown in FIGS. 3 and 4. Hence the output current $I_{out}$ can be set by varying the resistance value of the resistor 16 or the current mirror ratio n of the current mirror circuit, shown in FIG. 6.

In FIG. 6, since the base current of the NPN transistor 24 is equal to the base current $I_{B1}$ of the NPN transistor 15, the base to emitter voltage $V_{BE}$ of the NPN transistor 24 equals with that of the NPN transistor 15. With the collector current $I_t$ of the NPN transistor 24 and the resistance value $R_2$ of the resistor 25, when the voltage $V_{in}$ is applied to the input terminal 21, the collector current $I_t$ is expressed by the following formula:

$$I_t = (V_{in} - V_{BE})/R_2 \qquad (15)$$

Moreover, the formulas (15) and (3) can be transformed to the following formula:

$$I_t = (R_1/R_2)(V_{in} - V_{BE})/R_1 = (R_1/R_2) I_{ref} \qquad (16)$$

Figure 7:
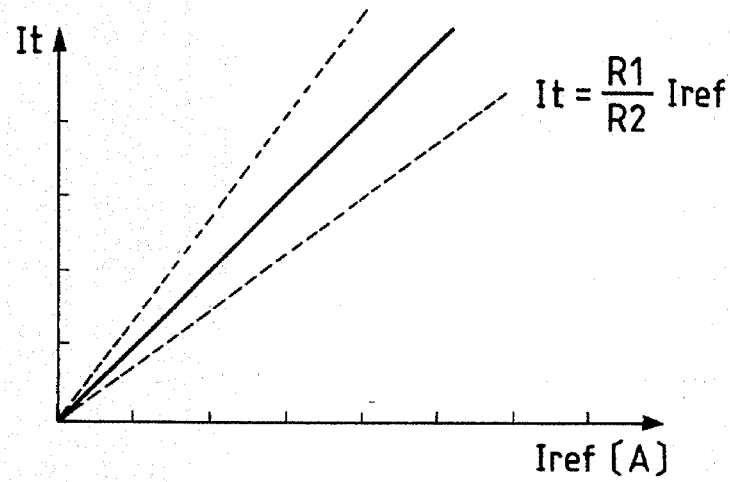
FIG. 7 is a characteristic diagram showing the relationship between internal reference current and reference current from a current source shown in FIG. 6.

The relationship of the formula (16) is shown in FIG. 7. If the current mirror ratio of the current source 12 is 1/X, the output current $I_{od}$ from the current source 12 is expressed by the formula (17):

$$I_{od} = X I_t = X(R_1/R_2) I_{ref} \qquad (17)$$

The output current $I_{od}$ of the current source 12 is proportional to $I_{ref}$ as expressed by the formula (17). The output current $I_{od}$ of the current source 12 can be varied by varying the resistance value $R_2$ of the resistor 25 or the current mirror ratio X of the current source 12. Such an adjustment can optimize the rise time of the output current $I_{out}$ of the driver circuit according to the load capacity thereof.

Figure 8:
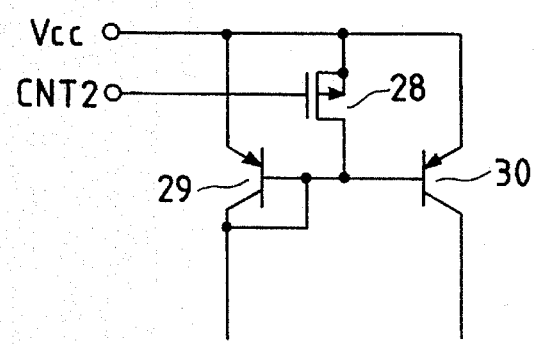
FIG. 8 is a circuit diagram partially showing a driver circuit according to another embodiment of the present invention.
Figure 9:
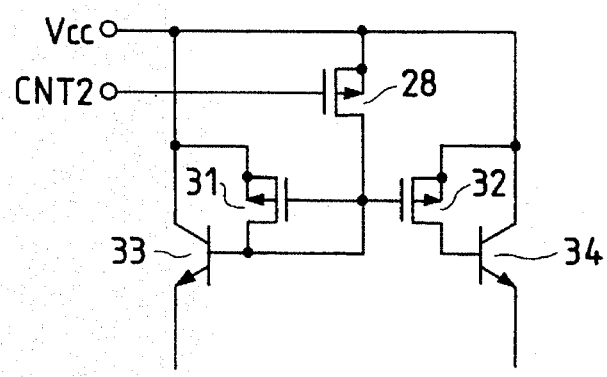
FIG. 9 is a circuit diagram partially showing a driver circuit according to another embodiment of the present invention.

FIGS. 8 and 9 are circuit diagrams partially showing another embodiment of the driver circuit according to the present invention, respectively.

FIG. 8 is a circuit diagram showing a current mirror circuit in the current source 12 including PNP transistors as active elements used instead of the MOS transistors shown in FIG. 6.

In this embodiment, PNP transistors 29 and 30 can be used for the current mirror circuit in the current source 12 to increase the drive capability of the current source 12. Hence the load drive capability of the driver circuit can be increased.

FIG. 9 shows an example of a current mirror circuit in the current source 12 in which PNP transistors and NPN transistors are used as active elements. The NPN transistors 33 and 34 have a current amplifying factor ($h_{FE}$) larger than the PNP transistor with an emitter size equal to the NPN transistors 33 and 34. Hence, in this embodiment, when a current source is formed with a drive capability similar to that in the embodiment in FIG. 8, the NPN transistor can be decreased in size, in comparison with that in the embodiment shown in FIG. 8.

Figure 10:
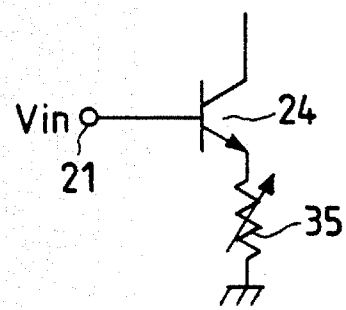
FIG. 10 is a circuit diagram partially showing a driver circuit according to further another embodiment of the present invention.

FIG. 10 is a circuit diagram partially showing another embodiment of the driver circuit according to the present invention.

FIG. 10 shows a variable resistor 35 used instead of the resistor 25 in FIG. 6 to vary the output current of the current source 12. This structure can optimize the rise time of the output current in the driver circuit.

According to the driver circuit and the semiconductor light emitting element driver circuit of the present invention, since current supplying means is arranged so as to supply current to the control electrode of the output transistor in the current mirror circuit, the load such as a semiconductor light emitting element can be operated at a higher switching rate, comparing to the conventional one.

Since the current supplying means can be set to its output current in proportional to the input signal voltage and the internal reference current in the current mirror circuit, the drive capability of the driver circuit can be optimized.

Furthermore, if the current supplying time of the current supplying means is shorter than the current outputting period of the current mirror circuit, arranging the current supplying means can suppress an increase in consumed current to a minimum value.

Next, an explanation will be made below as for a photoelectric converter device and a memory circuit which can be combined with the driver circuit described above.

Figure 11:
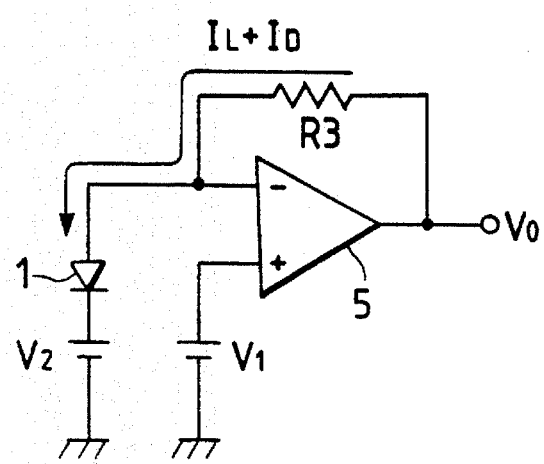
FIG. 11 is a circuit diagram showing a structural example of a conventional photoelectric converter device.

A conventional photo diode built-in photoelectric converter device, as shown in FIG. 11, is formed of a current to voltage converter such as an operational amplifier 5, and a photo diode 1 directly connected to the inverted input terminal. The photo diode 1 generates a photo current $I_L$ in response to light irradiation. The photo current is converted to an output voltage corresponding to light amount. The voltage $V_1$ is applied to the non-inverted input terminal of the operational amplifier 5.

With $V_1$ and $V_2$ applied to its cathode, the pn junction of the photo diode 1 is set to zero bias ($V_1 = V_2$) or a reverse bias ($V_1 < V_2$).

Figure 12:
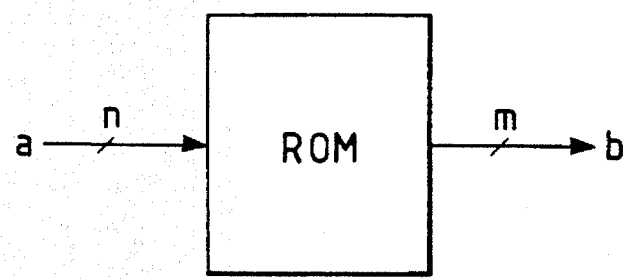
FIG. 12 is a diagram explaining a data input/output operation of a ROM.

Conventional read-only memory (ROM) is constituted as shown in FIGS. 12 and 13. As shown in FIG. 12, the ROM can output an arbitrary output b when an address signal a is inputted. The total bit number of the ROM is defined by $2^n \times m$. In MOS type ROMs, data are generally formed accordance to the physical layout or connection of MOS transistors. FIG. 13 shows a ROM structure where the MOS transistor m00 is not connected to others.

The operation of the ROM structure will be explained below in detail. First let us consider the data shown in Table 1.

TABLE 1

| Word address | Data |
|---|---|
| a0 | 10 |
| a1 | 11 |
| . | |
| . | |
| . | |

With reference to Table 1, when a word address "a0" is input to the ROM shown in FIG. 13, data "10" is outputted. When a word address "a1" is inputted to the ROM, data "11" is outputted. In this case, the ROM structure is operated according to the timing shown in FIG. 14.

It is assumed that the pre-charge circuit (refer to FIG. 13) precharges the outputs D1 and D2 to a high level during the low level of the clock signal (CK). Next, n-bit address signal a, as shown in FIG. 12, inputted to the ROM is decoded by a predetermined address decoder circuit to determine word addresses "a0, a1, . . . " (hereinafter, the output of the decoder circuit is called a word address). When a word address "a0" is selected, the corresponding signal line becomes a high level while the other signal lines become low levels. This situation is applicable even when the word line a1 is selected.

When the word line a0 is selected while the clock signal CK is in a high level, the MOS transistor m01 is turned on, whereby the output of the pre-charge circuit becomes a high impedance, thus making the output line q1 in a low level. The inverter I1 inverts the signal on the output line q1 to produce the output D1 in a high level. Since the output line q0 is not connected to the MOS transistor m00, it remains in a high level. The high level is held for a fixed time because of the parasitic capacitance associated with the output line q0. The inverter I0 inverts the signal on the output line q0 to output an output D0 of a low level or data "10". Even when the word address a1 is selected, data "11" is outputted from the ROM. In the ROM configuration, in order to determine the output data of the word address a0, it may be considered that no MOS transistor m00 is physically formed, in place of the MOS transistor m00 which is not connected to the output line q0.

Conventional art related to the sequential access memory according to the present invention will be explained below.

In sequential access memory, desired memory information is obtained by sequentially accessing arranged information. The access time depends on the storage location and is generally slow in comparison with random access memories.

Conventionally, sequential access memory is formed of a counter and a memory having an address decoding function to specify a memory cell to be read or written. The counter is a pointer specifying an address sequentially.

Figure 15:
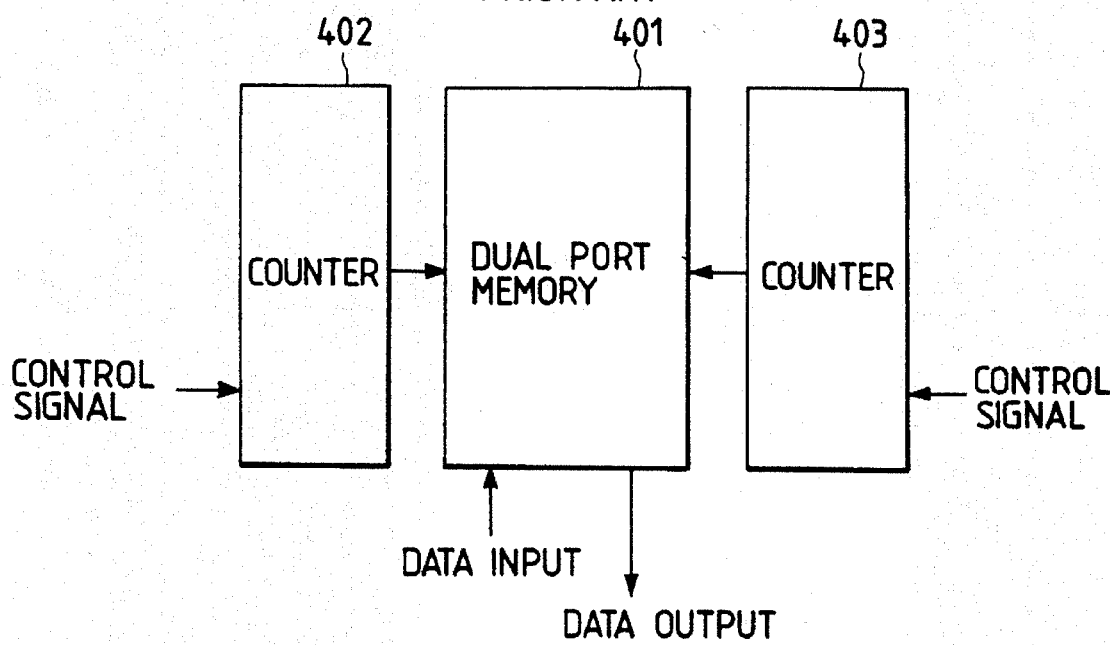
FIG. 15 is a circuit diagram of a conventional dual port memory (FIFO)

To boost the operational speed of the sequential access memory, input/output data is demultiplexed or multiplexed and a memory array is divided in bank or block to data for some cycles to read them alternately. In a certain case, a shift register has been used instead of the counter decoder to realize the smaller area and higher speed. FIG. 15 is a circuit diagram showing a FIFO (first-in first-out) including a dual port memory 401 and two counters 402 and 403.

Figure 16:
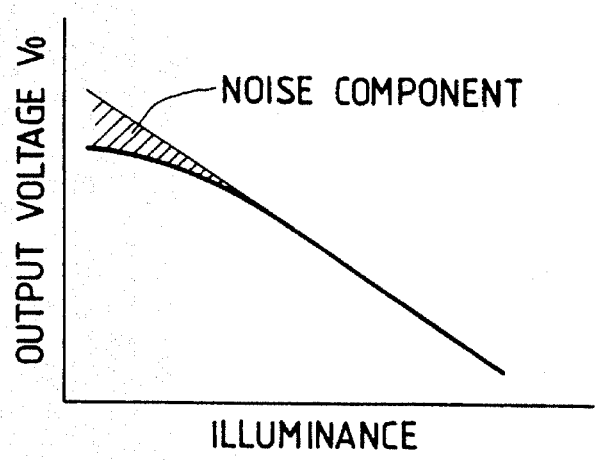
FIG. 16 is a characteristic diagram showing the relationship between illuminance and photo output of a conventional photoelectric converter device.
Figure 17:
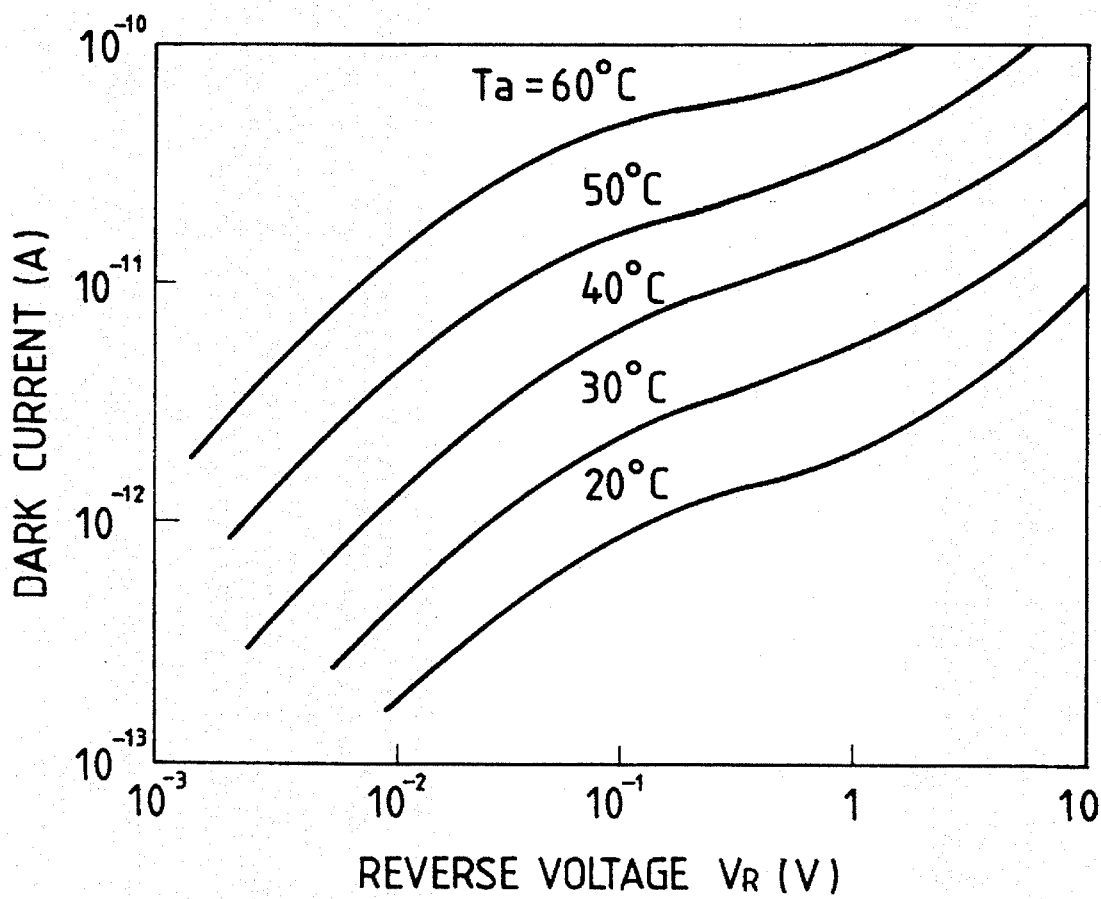
FIG. 17 is a characteristic diagram showing a dependence on temperature and reverse bias voltage of dark current of a photo diode.
Figure 20:
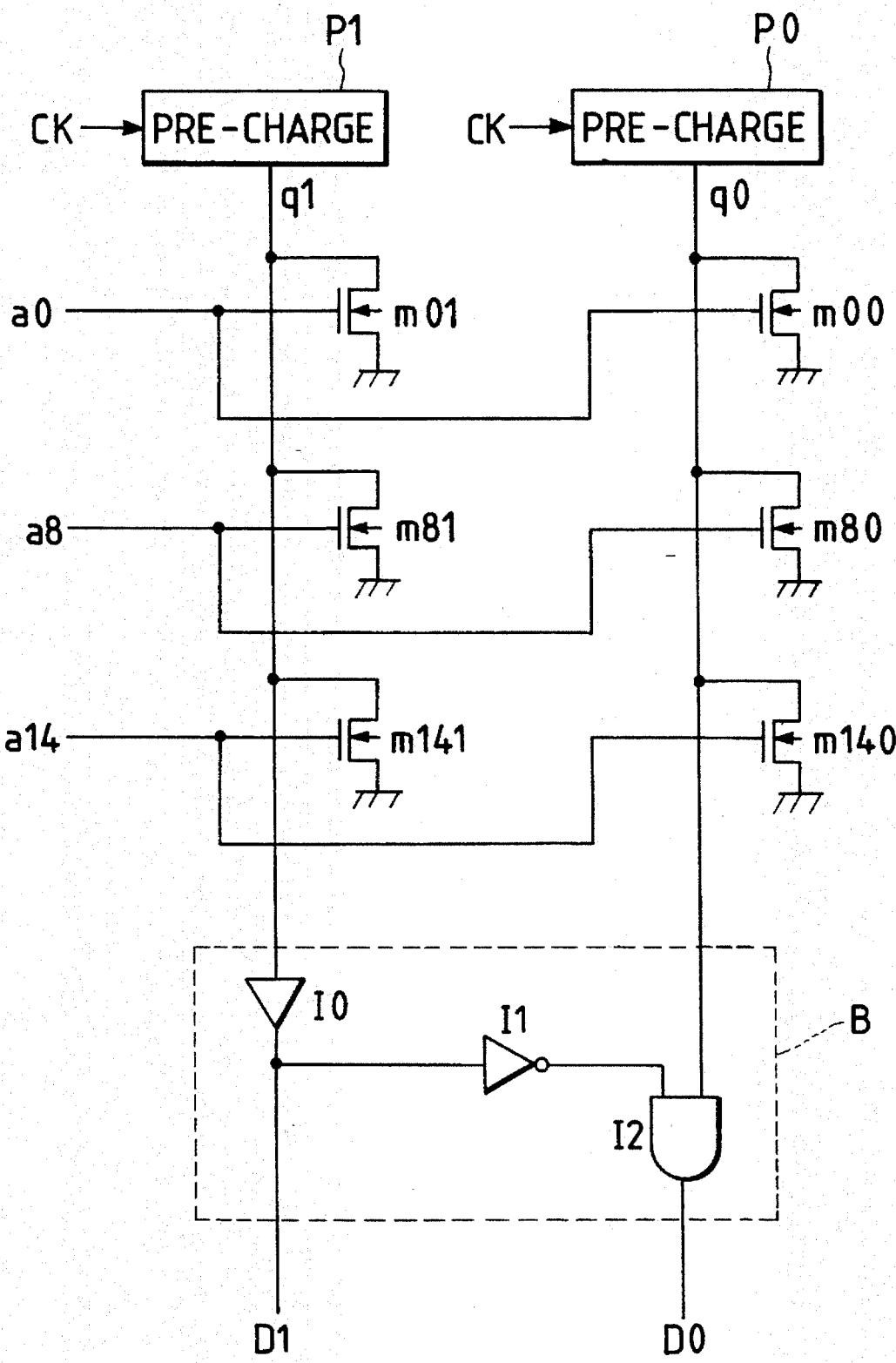
FIG. 20 is a circuit diagram showing a ROM circuit according to a first embodiment of the present invention.

However, in the conventional photoelectric converter device, since the photo diode 1 flows a dark current $I_D$ at a light amount of zero, a noise component appears on the output in the low illuminance region. That is, the output $V_O$ of the conventional ROM configuration, shown in FIG. 20, is expressed by the following formulas (1) and (2):

$$V_O = V_1 - R_3 I_L \text{ (large amount of light } I_L \gg I_D) \quad (1)$$

$$V_O = V_1 - (R_3 I_L + R_3 I_D) \text{ (small amount of light } I_L = I_D) \quad (2)$$

where the third term $(-R_3 I_D)$ of the right member in the formula (2) represents a noise component due to a dark current $I_D$. The noise component curves the linearity of the light output in the low illuminance region as shown in FIG. 16, thus limiting the light measurement in the low illuminance region. Furthermore there is a disadvantage in that since the dark current $I_D$ varies largely by depending on temperature and the reverse bias voltage across the pn junction of the photo diode 1, as shown in FIG. 17, the usage condition and environment affects largely the light measurement limit.

As described above, the conventional memory device with an n-bit address input a and an m-bit output b has a total bit number of $2^n \times m$. If the ROM data producing means shown in FIG. 13 is formed, an area corresponding to MOS transistors of $2^n \times m$ is needed to realize the ROM structure.

Therefore, there is a disadvantage in that the increased total bit number causes an increase in area, an increase in manufacturing cost and a decreased operational speed.

The conventional sequential address memory, which is realized using a counter and a memory having an address decoding function, results in a degradation in the performance (cycle time) due to address decoding and an increase in chip area occupied by the decoder circuit. If the high speed operation of such a sequential access memory is realized using a multiplexer, demultiplexer or bank configuration, the additional circuits cause an increased circuit scale and a complicated circuit configuration.

Moreover even if the shift register is used for circuits to shrink to a small area and to operate at high speed, thus eliminating a memory address decode time, the ROM cannot provide sufficient characteristics in some duty ratios of an external control (clock) signal. This is because the memory is generally controlled so as to perform different and independent operations to each potential of clocks, thus requiring different operational time. In large capacity memories, the memory cell array is divided according to a mask pattern, it is difficult to control each of divided array sections.

The photoelectric converter device according to the present invention is characterized by a photo diode; a pn junction diode which is analogous to the photo diode and shielded from light; current amplifying means for multiplying a reverse saturation current of the pn junction photo diode by an analogous ratio of the photo diode and the pn junction diode; and output means for outputting a current obtained by subtracting a current amplified by the current amplifying means from a current generated from the photo diode.

According to the present invention, the memory device which stores plural data fixed on data storage elements and provides arbitrary data in response to an arbitrary selection signal is characterized by means for determining data with high occurrence frequency when data with high occurrence frequency is selected, the means having no data storage elements for determining data with high occurrence frequency.

A sequential access memory according to the present invention circuit is characterized by a shift register for selecting a row address and a column address of a memory cell array; and control means for producing an internal control signal and a divided frequency signal in response to an external control signal and for operating a shift register.

A photoelectric device according to the present invention including a photo diode; a pn junction diode which is analogous to the photo diode and shielded from light; current amplifying means for multiplying a reverse saturation current of the pn junction photo diode by an analogous ratio of the photo diode and the pn junction diode; and output means for outputting a current obtained by subtracting a current amplified by the current amplifying means from a current generated from the photo diode. The noise component due to dark current of the photo diode in the low illuminance region can be compensated by subtracting a current from a current (photo current $I_L$+dark current $I_D$) generated by the photo diode, said current being the reverse saturation current amplified by the current amplifying means and being the analogous ratio times the reverse saturation current of a pn junction diode, and by outputting the outcome from the output means.

The memory device according to the present invention includes means which has no data producing memory elements with high occurrence frequency in data in a memory device such as a ROM and which determines data when the address of the omitted data memory element is accessed. The data with low occurrence frequency is outputted based on the data memory element and data with high occurrence frequency is outputted data determined by the means. Omitting data memory element for producing data with high occurrence frequency can reduce the number of total bits.

The sequential access memory according to the present invention includes a shift register acting as an address pointer. Since the shift register operates with an internal control signal and a divided frequency signal each formed from an external control signal, a high speed and small sequential access memory can be constructed.

Figure 18:
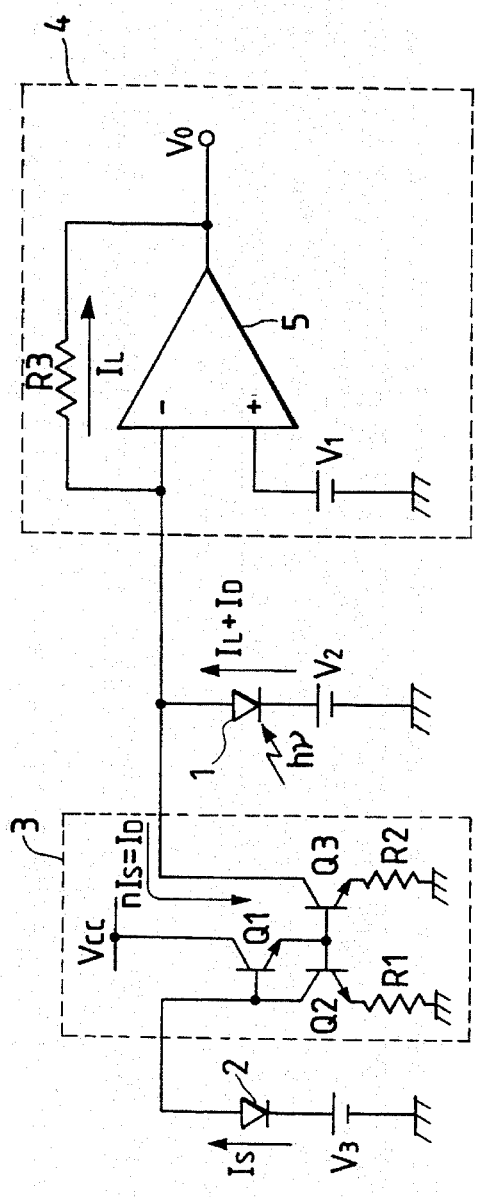
FIG. 18 is a circuit diagram showing a photoelectric converter device according to a first embodiment of the present invention.

FIG. 18 is a circuit diagram showing the photoelectric converter device according to a first embodiment of the present invention. Referring to FIG. 18, the photoelectric converter device includes a photo diode 1, a pn junction diode analogous to the photo diode 1, current amplifying means 3 formed of a current mirror circuit, a current to voltage converter unit (output means) formed of the operational amplifier 5.

When being illuminated with light, the photo diode 1 produces the sum $(I_L+I_D)$ of photo current $I_L$ and a dark current $I_D$. Since the pn junction diode 2 is analogous to the photo diode 1 (analogous ratio of 1:n), the reverse saturation current $I_S$ is expressed by the following formula (7) if the reverse bias value due to the voltage $V_3$ is equalized to $(V_2-V_1)$:

$$I_S=I_D/n \qquad (7)$$

The current $I_S$ is an input current flowing through the current mirror circuit which is formed of the current amplifying means 3 including transistors Q1 to Q3 and resistors $R_1$ and $R_2$. If the resistor $R_2$ is set by the following formula:

$$R_2=(1/nI_S)[(R_1 \cdot I_S)-(kT/q)I_n n] \qquad (8)$$

the output current of the current mirror circuit is equalized to the dark current $I_D$ of the photo diode 1:

$$nI_S=I_D \qquad (9)$$

Therefore, only a photo current component $I_L$ flows through the resistor $R_3$ (connected between the output terminal and the inverted input terminal of the operational amplifier 5) in the current to voltage converter unit 4 according to Kirchhoff's law. The output voltage $V_O$ is expressed by the following formula (10):

$$V_O=V_1-R_3 \cdot I_L \qquad (10)$$

Therefore the noise component due to the dark current $I_D$ is compensated so that the linearity of the photoelectric converter output can be extended toward the low illuminance region. Variations in temperature can be largely decreased because a current n times the reverse saturation current $I_S$ of the pn junction diode 2 is subtracted from the dark current $I_D$, but only the amplification error of the current amplifying means 3 due to temperature appears on the output.

In the present embodiment, the current mirror circuit being the current amplifying means 3 is formed of bipolar transistors. However the similar effect can be obtained by the current mirror circuit formed of MOS transistors.

Figure 19:
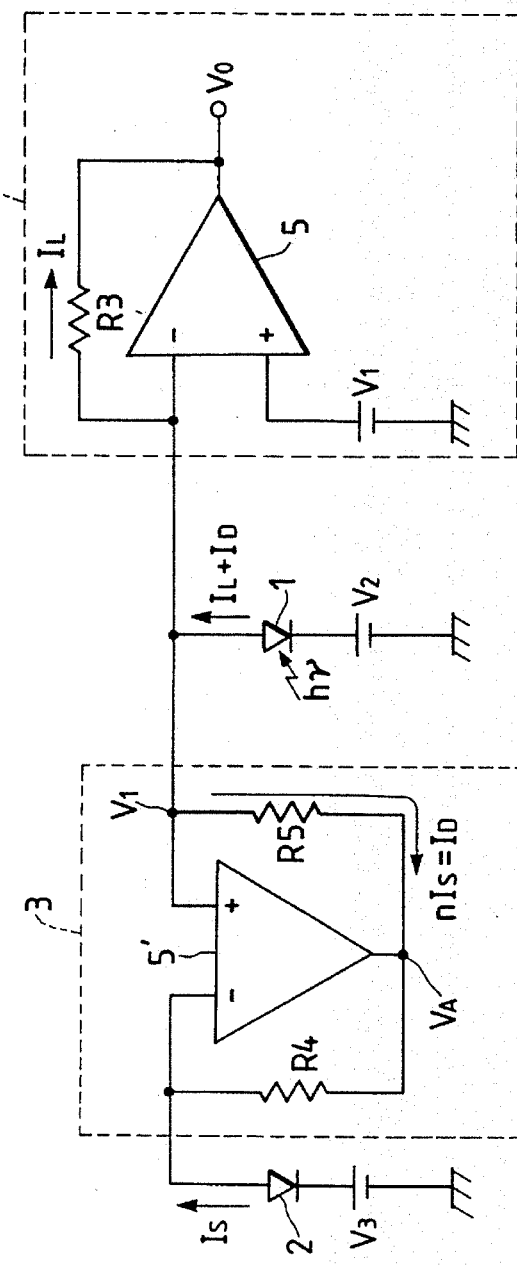
FIG. 19 is a circuit diagram showing a photoelectric converter device according to a second embodiment of the present invention.

FIG. 19 is a circuit diagram showing the photoelectric converter device according to the second embodiment of the present invention. The second embodiment is different from the first embodiment in that the current amplifying means 3 is formed of an operational amplifier 5'. The resistor $R_4$ is connected between the output terminal and the inverted input terminal of the operational amplifier 5' and the resistor $R_5$ is connected between the output terminal and the non-inverted input terminal.

In the present embodiment, the reverse saturation current $I_S$ of the pn junction diode 2 flows through the resistor $R_4$. The output $V_A$ of the operational amplifier 5' is expressed by the formula (11) with voltage $V_1$ at the virtual ground point:

$$p\ V_A=V_1-R_4 \cdot I_S \qquad (11)$$

If $R_5$ is expressed by the following formula:

$$R_5=R_4/n \text{ (n: similarity ratio)} \qquad (12)$$

the current expressed by the following formula (13) flows through resistor $R_5$:

$$nI_S=I_D \qquad (13)$$

The output voltage $V_O$ is expressed as the following formula (14) by subtracting the current $(I_L+I_D)$ generated by the photo diode 1 from the current expressed by the formula (13):

$$V_O=V_1-R_3 \cdot L_L \qquad (14)$$

Thus the noise component due to the dark current $I_D$ is compensated.

FIG. 20 is a circuit diagram showing a ROM configuration according to a first embodiment of the present invention and most clearly showing the feature of the present invention. In FIG. 20, the ROM structure includes a precharge circuit P1 for precharging output line q1, a precharge circuit P0 for precharging the output line q0, and MOS transistors m00, m01, m80, m81, m140 and m141 for determining ROM data, respectively. Address a0, a8 and a14 selects any one of address lines from the physical address space in the ROM. In FIG. 20, when data with the highest occurrence frequency is omitted from the ROM data, the means B determines the output when an address is inputted to access the omitted data being data with the highest occurrence frequency among the ROM data. The output determining means B is constituted of a buffer I0 connected to the output line q1 for outputting the output D1, an inverter I1 connected to the output of the buffer I0 and an AND circuit I2 connected to the output of the inverter I1 and the output line q0 for outputting the output D0.

The operation of the ROM will be sequentially explained below. The timing chart, shown in FIG. 14 and used for the conventional ROM, is used as an example of the operational timing. In the present embodiment, the ROM data in the Table 2 will be explained below.

TABLE 2

| Address | Data D1, D0 | Address | Data D1, D0 |
|---------|-------------|---------|-------------|
| a0 | 0 | a8 | 1 |
| a1 | 2 | a9 | 2 |
| a2 | 2 | a10 | 2 |
| a3 | 2 | a11 | 2 |

TABLE 2-continued

| Address | Data D1, D0 | Address | Data D1, D0 |
|---------|-------------|---------|-------------|
| a4      | 2           | a12     | 2           |
| a5      | 2           | a13     | 2           |
| a6      | 2           | a14     | 0           |
| a7      | 2           | a15     | 2           |

When the ROM shown in FIG. 12 receives an address signal a, the address decoder selects any one bit of the physical address a0 to a15. All bits of the ROM data, as shown in Table 2, indicate "2", except address data a0, a8 and a14.

When an address signal a is inputted to select an address a0, the precharge circuits P0 and P1 precharge the output lines q0 and q1 to a high level, respectively, during the low level period of the CK signal. When the CK signal turns to a high level, since the MOS transistors m01 and m00 are in on state, the output lines q1 and q0 become a low level, whereby data "0" is determined.

Next, when the address a1 is selected, since all signal lines corresponding to the addresses a0, a8 and a14 are in low level, the transistors m00 to m141 are in off state so that the output lines q0 and q1 are precharged to high level during the low level period of the CK signal. Then even if the CK signal turns to a high level, the output line q1 remains the high level, so that the output D1 is determined to a high level. In the output determining means B, the output D1 is inverted by the inverter $I_1$, and the inverted output fixes the output of the AND circuit I2 to a low level, thus determining the output D0 to a low level. As a result, the means B outputs the output data "2". In the like manner, when addresses except the address a0, a8 and a14 are accessed, all outputs become "2". When the address a8 is accessed, the output is "1". When the address a14 are accessed, the output i s "0".

When data shown in Table 2 is stored, the conventional method requires a layout space occupied by 32 (16×2) MOS transistors because of 16 addresses (for example, in FIG. 12, the address a being formed of at least 4 bits in binary form) and 2-bit output. The present embodiment requires only 6 transistors to handle the addresses a0, a8 and a16, thus largely shrinking an area occupied by MOS transistors.

If the address a, shown in FIG. 12, is inputted to select one of addresses a0 to a15 in FIG. 20, the embodiment does not care about the input types. The ROM data accessing and ROM data preparing can be arbitrarily selected. The size of the address space and the number of output bits can be set without any limitation. When omitted address is accessed, the output determining means can be formed of any types of logic circuits if desired outputs are determined.

A mask ROM according to the second embodiment of the present invention will be explained below. The mask ROM includes 3-bit address data for inputting 16 addresses after decoding, 3-bit output data, and a ROM data file storing the content shown in the following Table 3.

TABLE 3

| Address | Data | Address | Data |
|---------|------|---------|------|
| a0      | 0    | a8      | 0    |
| a1      | 0    | a9      | 0    |
| a2      | 0    | a10     | 0    |
| a3      | 3    | a11     | 7    |
| a4      | 0    | a12     | 0    |
| a5      | 0    | a13     | 0    |
| a6      | 5    | a14     | 0    |
| a7      | 0    | a15     | 0    |

Figure 21:
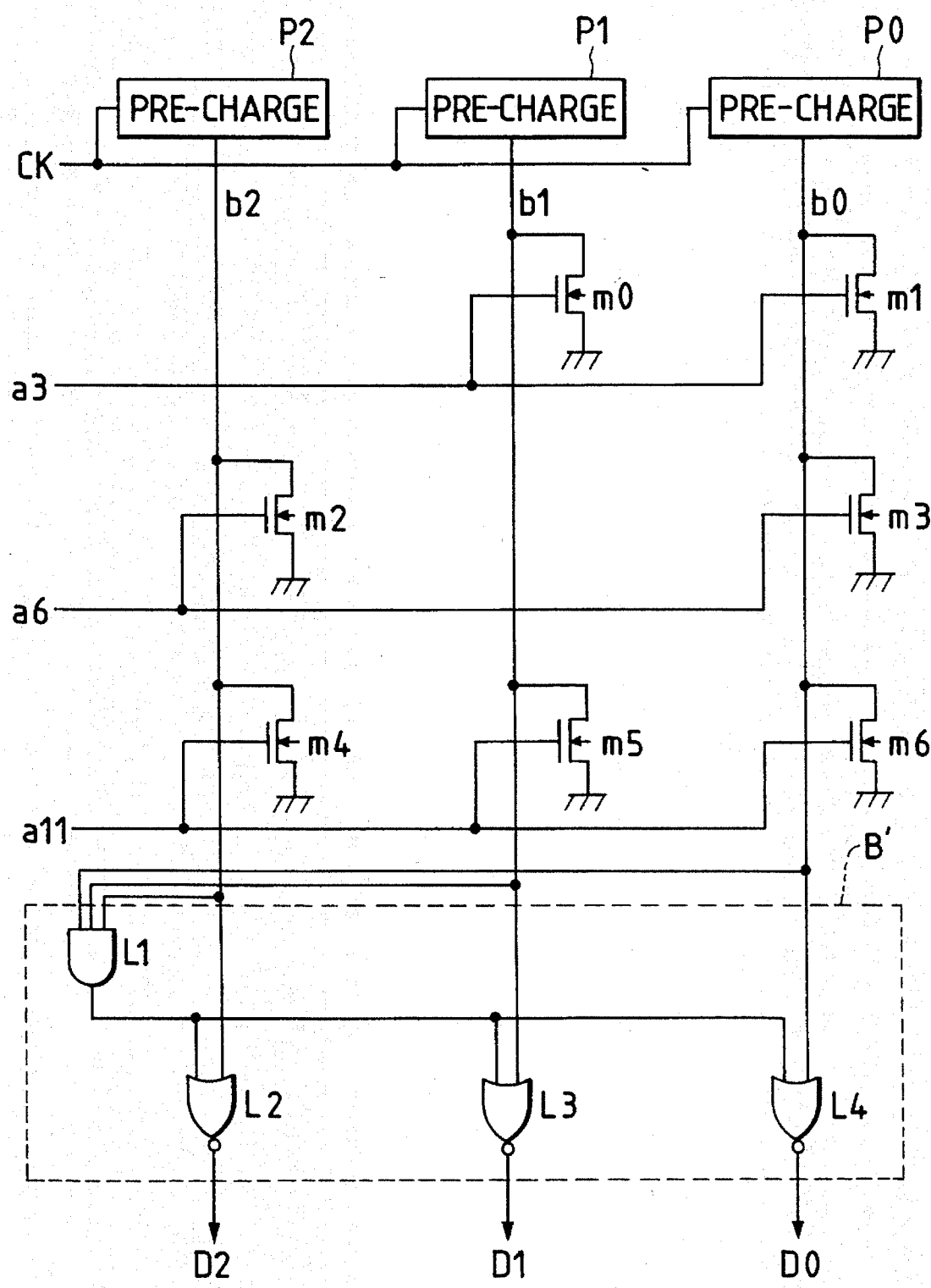
FIG. 21 is a circuit diagram showing a mask ROM showing a second embodiment of the present invention.

FIG. 21 is a circuit diagram showing a mask ROM according to a second embodiment of the present invention.

Figure 22:
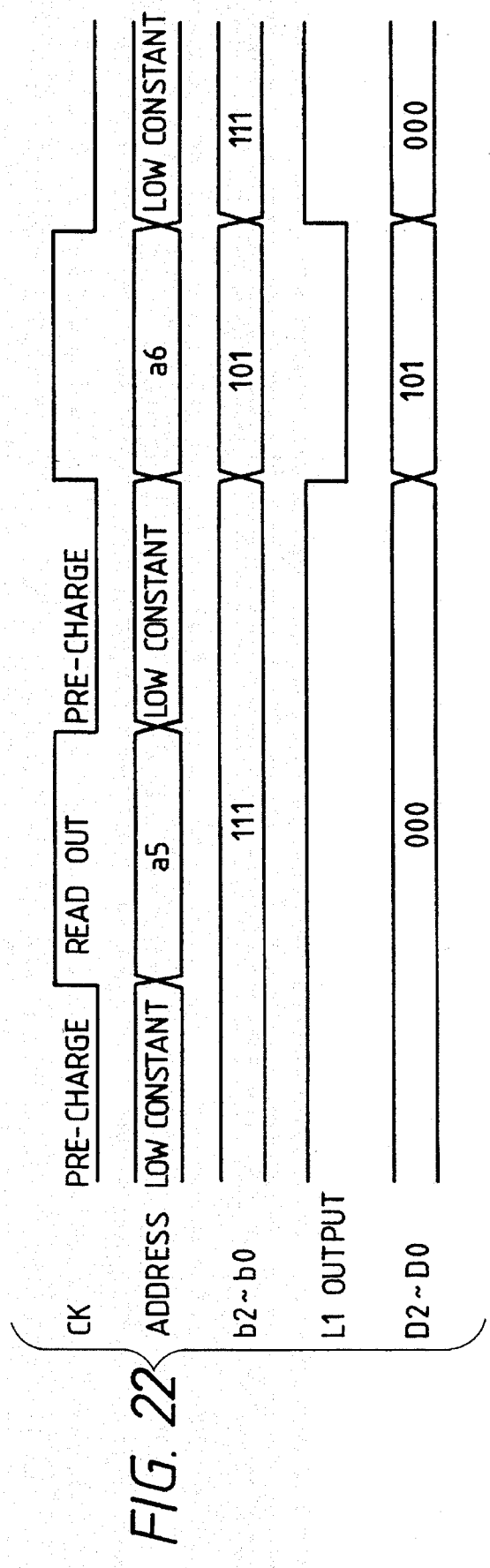
FIG. 22 is a timing chart showing an operation of the mask ROM shown in FIG. 18.

FIG. 22 shows a timing chart showing the operation of the mask ROM. In FIG. 21, the precharge circuits P2, P1 and P0 for precharging the output lines b2, b1 and b0, respectively. The MOS transistors m0 to m6 determines ROM data, respectively. Addresses a3, a6 and all select any one of physical address spaces in the ROM. In FIG. 21, if data with the highest occurrence frequency is omitted from ROM data, the output determining means B' determines the corresponding output when an address is inputted to access the omitted data which is data with the highest occurrence frequency among ROM data. The output determining means B' is formed of an AND circuit L1 connected to the output lines b2 to b0 and an NOR circuits L2 to L4 connected to either the output of AND circuit L1 or one of the output lines b2 to b0.

As shown in FIGS. 21 and 22, when the CK signal is in a low level during a precharge period, all the output lines b2 to b0 connected to the precharge circuits P0 to P2 are in high level. The high level represents a logical "1" and the low level represents a logical "0". During a precharging period, the signal lines corresponding to addresses a3, a6 and all are in a low level while all the MOS transistors m0 to m6 are turned off.

Next, when the CK signal changes to a high level to enter a reading period, the outputs of the precharge circuits P0 to P2 become a high impedance. As a result, the potentials of the output lines b0 to b2 are maintained at high level as long as the MOS transistors m0 to m6 are turned off.

Then even if the address a5 is inputted to the ROM, the output lines b0 to b2 remains to a high level because no decoder exists physically to decode the address a5. Hence the AND circuit L1 outputs "1" while the NOR circuit L2 to L4 outputs "0", whereby the outputs D2 to D0 are determined to "0".

Next, when the address a6 is inputted to the ROM, the MOS transistors m2 and m3 are turned on during the reading period while the output lines b2, b1 and b0 are set to "0", "1" and "0", respectively. Since the AND circuit L1 outputs "0", the NOR circuits L2 to L4 invert the output lines b2 to b0 so that the output lines D2 to D0 are set to "1", "0" and "1", or "5" in a hexadecimal notation. Sequentially, necessary data can be established.

Figure 23:
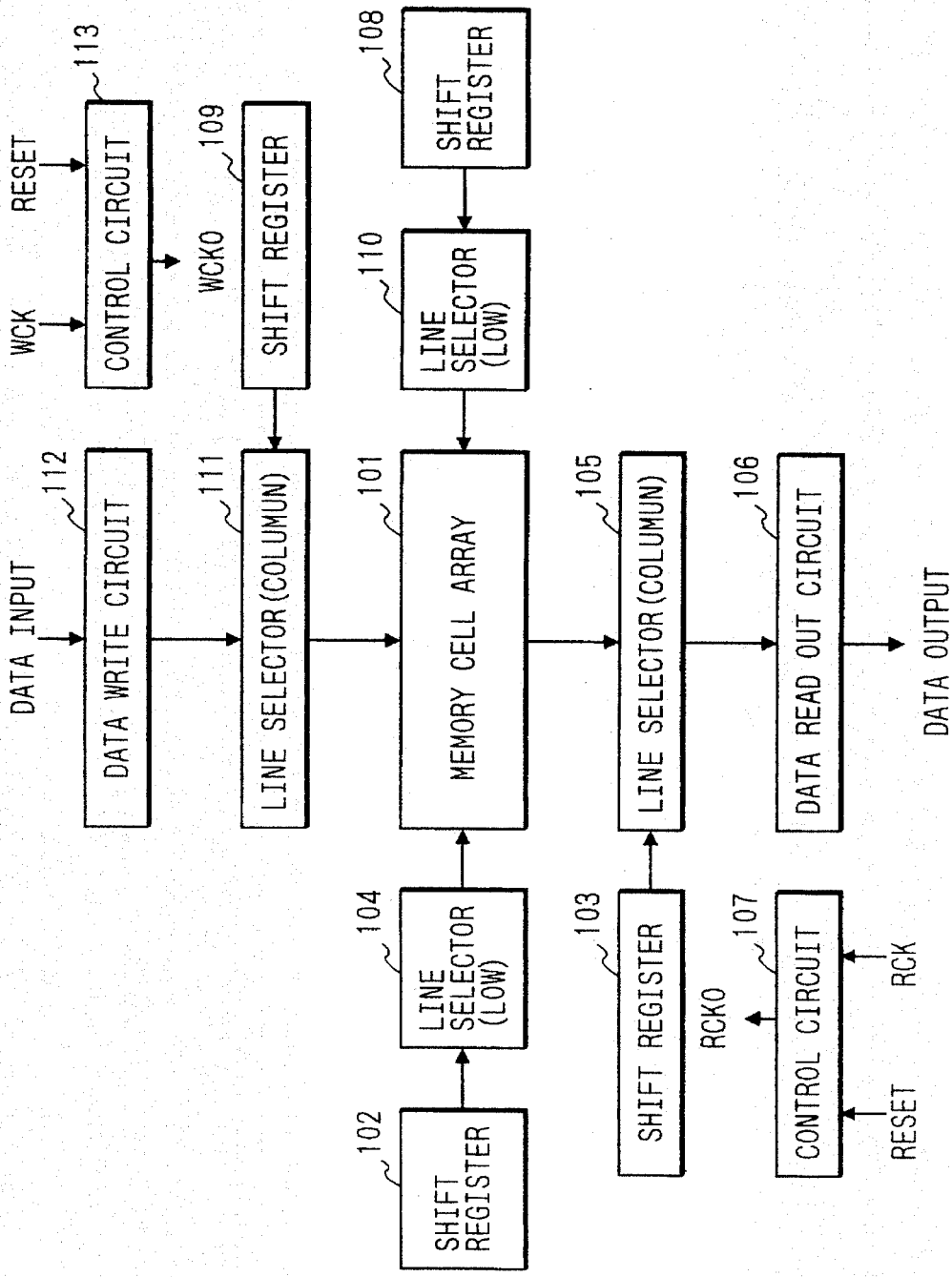
FIG. 23 is a circuit diagram showing a dual port memory (FIFO) embodying the present invention.

FIG. 23 is a circuit diagram showing a sequential access memory according to a first embodiment of the present invention. FIG. 23 shows a FIFO (First-in First-out) in a dual port memory configuration. Referring to FIG. 23, the memory circuit includes a dual port memory cell array 101, read port circuits 102 to 107 and write port circuits 108 to 113.

The read port circuit includes a read port address pointer 102 corresponding to a row line and a read port address pointer 103 corresponding to a column line. Each of the read port address pointers 102 and 103 is formed of a shift register. Numeral 104 represents a row line selector and 105 represents a column line selector. Numeral 106 represents a data reading circuit. Numeral 107 represents a read port control circuit for controlling circuit components including the address pointers 102 and the data reading circuit 106.

The write port circuit includes a write port address pointer 108 corresponding to a row line, a read port address pointer 109 corresponding to a column line. Each of the write port address pointers 108 and 109 is formed of a shift register. Numeral 110 represents a row line selector and 111 represents a column line selector. Numeral 112 represents a data writing circuit. Numeral 113 represents a write port control circuit for controlling circuit components including the address pointer 108 and the data writing circuit 112.

Elements 102 to 107 in the read port circuit operates synchronously to reading clocks. Elements 108 to 113 in the write port circuit operates synchronously to writing clocks.

Figure 24:
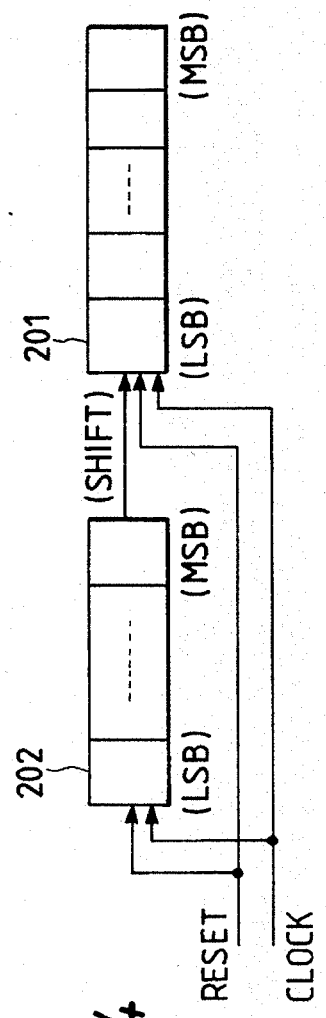
FIG. 24 is a diagram showing the structure of an address pointer formed of shift registers.

FIG. 24 is a circuit diagram showing a connection between a row shift register and a column shift register. In FIG. 24, numeral 201 represents a shift register corresponding to the row shift registers 102 and 108, and 202 represents a shift register corresponding to column shift registers 103 and 109.

Figure 25:
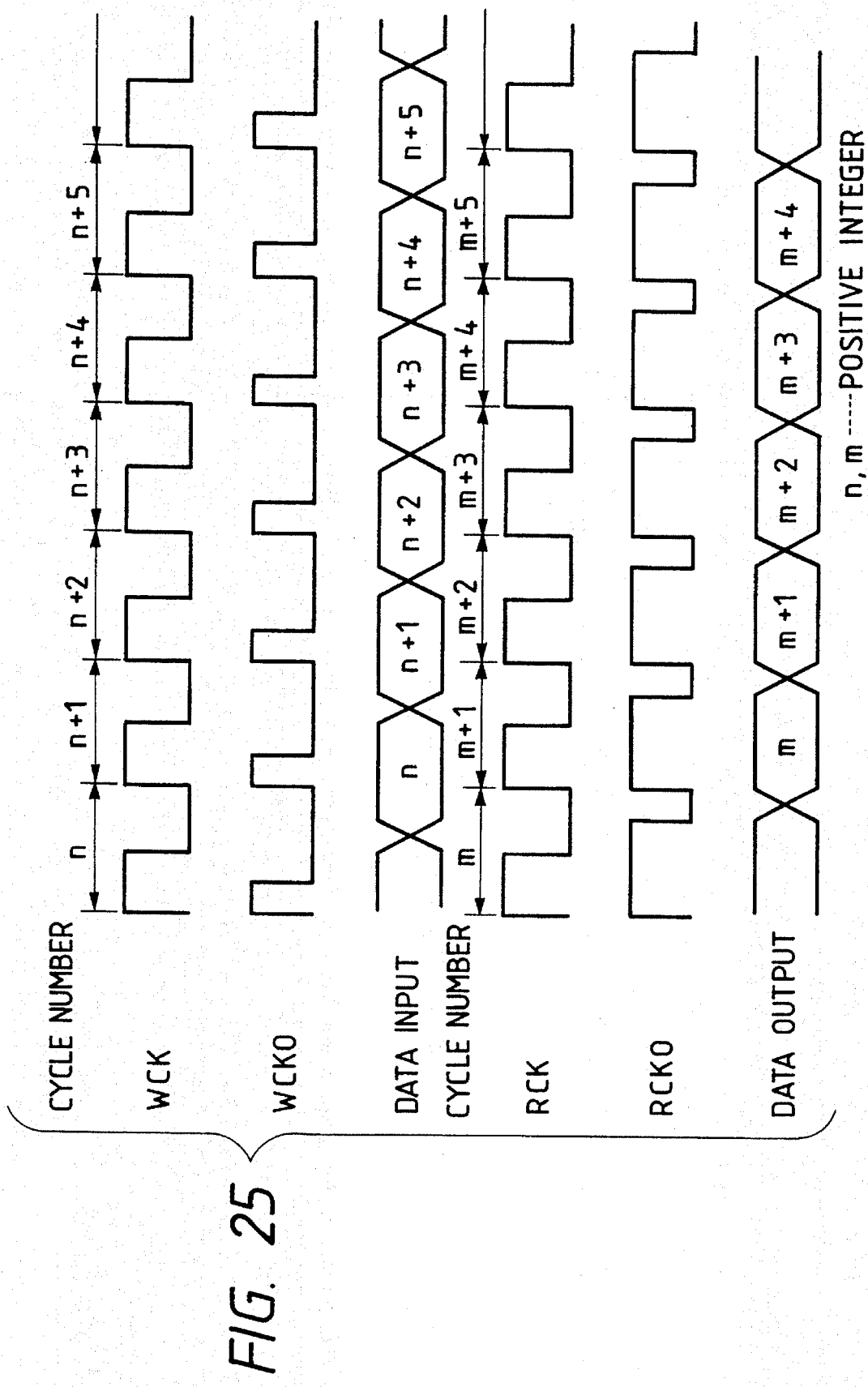
FIG. 25 is a timing chart of the memory circuit shown in FIG. 23.

The operation of the sequential access memory will be explained below. FIG. 25 is a timing chart used for explaining the operation of the sequential access memory.

After the shift registers 108 and 109 are set in response to a reset signal synchronizing with a WCK (external write clock signal) signal, input data is subjected to a writing operation in synchronization with the WCK signal. Each of the shift registers 108 and 109 has the same information as the line selection information which is decoded in address by a decoder in the memory. Hence a reset operation allows the row line and the column line to select "1" (selection information) to only the LSB (Least Significant Bit).

Every time an address is incremented synchronously with the WCK signal, the selection information is shifted by the shift registers 108 and 109. In this case, the shift register 109 shifts in synchronization with the WCK signal but the shift register 108 shifts only when the MSB of the shift register 109 indicates the selection information. When the shift registers 108 and 109 have the MSB including selection information, the selection information moves to the LSB in synchronization with the WCK signal. The line selectors 110 and 111 respectively select specific lines in the memory cell array 101, the specific lines correcting to selection information stored in the row shift register and the column shift register, to perform a data writing via the data writing circuit 112.

In the reading operation, elements 102 to 105 in the reading port circuit operate in synchronization with the RCK signal, like the writing port circuits 108 to 111 operated according to the WCK signal. The data reading means 106 amplifies and outputs the content of the memory cell array 101.

The row shift register and the column shift register are serially coupled to each other together with the reading port and the writing port, as shown in FIG. 24. This structure can select a specific row line and a specific column line on the memory cell array by shifting the row shift register only when the MSB of the column includes selection information.

Figure 26:
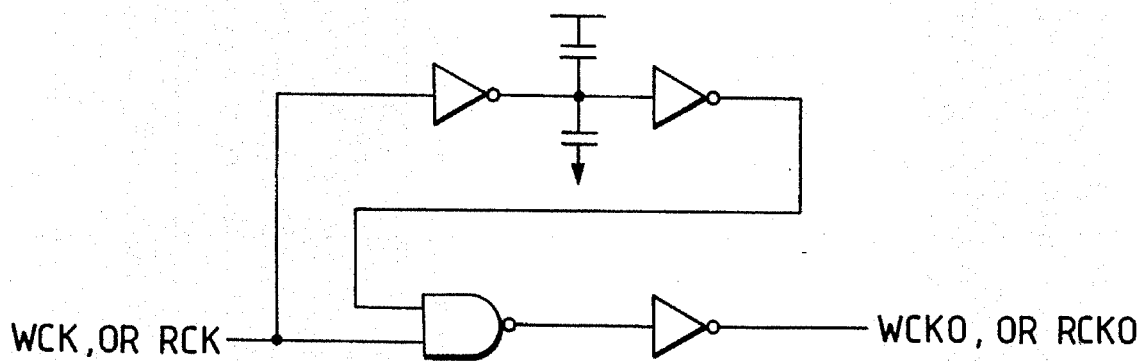
FIG. 26 is a circuit diagram showing an internal control signal producing circuit.

The present embodiment eliminates the address decoding time because the shift register in the memory performs an address selection instead of the address decoder. In FIG. 23, the reading port control circuit 107 produces a control signal WCKO in accordance with an external control signal WCK, the control signal having a duty ratio suitable to internal circuits. The writing port control circuit 113 produces a control signal RCKO in accordance with an external control signal RCK, the control signal having a duty ratio suitable to internal circuits. Hence an operation can be assured at a maximum operational frequency, independently of the duty ratio of the external control signal. Neglecting address decoding time can boost the highest operational frequency. FIG. 26 is a circuit diagram showing the reading port control circuit 107 and the writing port control circuit 113. In FIG. 26, the circuit produces a control signal WCKO or RCKO with a duty ratio suitable to the clock signal WCK or RCK.

Figure 27:
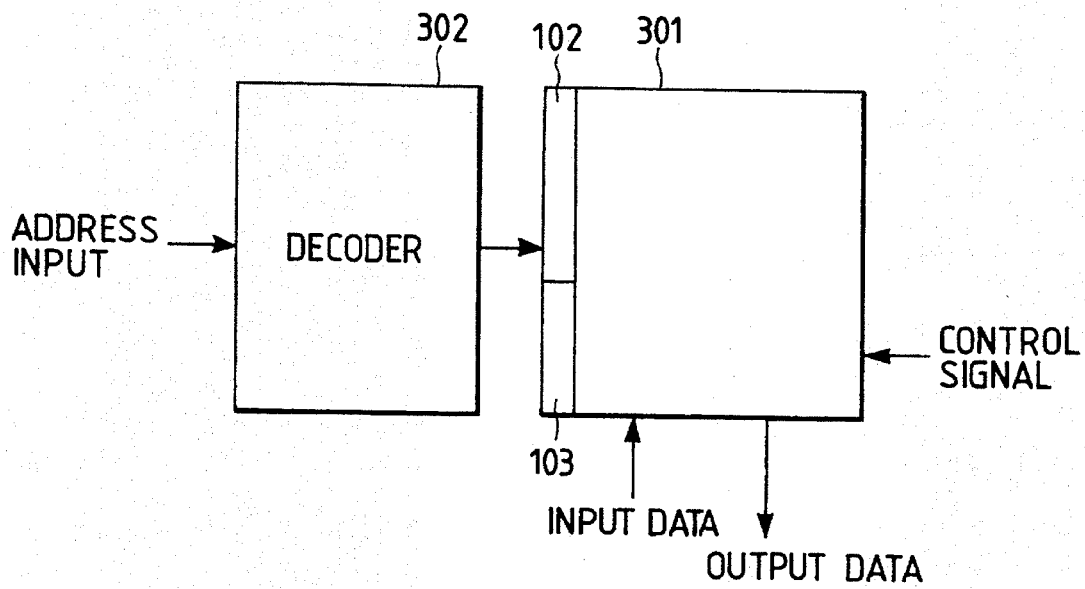
FIG. 27 is a circuit diagram showing a dual port memory (LIFO) embodying the present invention.

FIG. 27 is a circuit diagram showing a LIFO (Last-in First-out) in a dual port memory form according to the second embodiment of the sequential access memory of the present invention. In FIG. 27, numeral 301 represents a sequential access memory shown in FIG. 15, but the shift registers 102 and 103 operate reversibly as if the address is decremented in response to the clock signal RCK. The decoder 302 sets an address to the shift registers 102 and 103. After the address setting, the shift register in the sequential access memory 301 executes an address setting operation.

As explained above, the photoelectric converter device according to the present invention includes a photo diode; a pn junction diode which is analogous to the photo diode and is shielded from light; current amplifying means for multiplying a reverse saturation current of the pn junction photo diode by an analogous ratio of the photo diode and the pn junction diode; and output means for outputting a current obtained by subtracting a current amplified by the current amplifying means from a current generated from the photo diode. The noise component due to the dark current $I_D$ can be compensated by subtracting a current amplified by the current amplifying means from an output current (photo current $I_L$+dark current $L_D$) from the photo diode, whereby the linearity of the photo output can be maintained toward the low illuminance region.

The memory device according to the present invention can reduce the area occupied by the data memory elements in the memory device such as a ROM, thus enabling decreased manufacturing cost and improved operational speed.

In the sequential access memory according to the present invention, the address pointers are formed of only shift registers. Eliminating decoder circuits allows the chip size to shrink. The use of the internal control signals and a divided frequency signal producing circuit enables to realize a high speed memory that operates at a timing suitable to the memory internal circuits.

Figure 28:
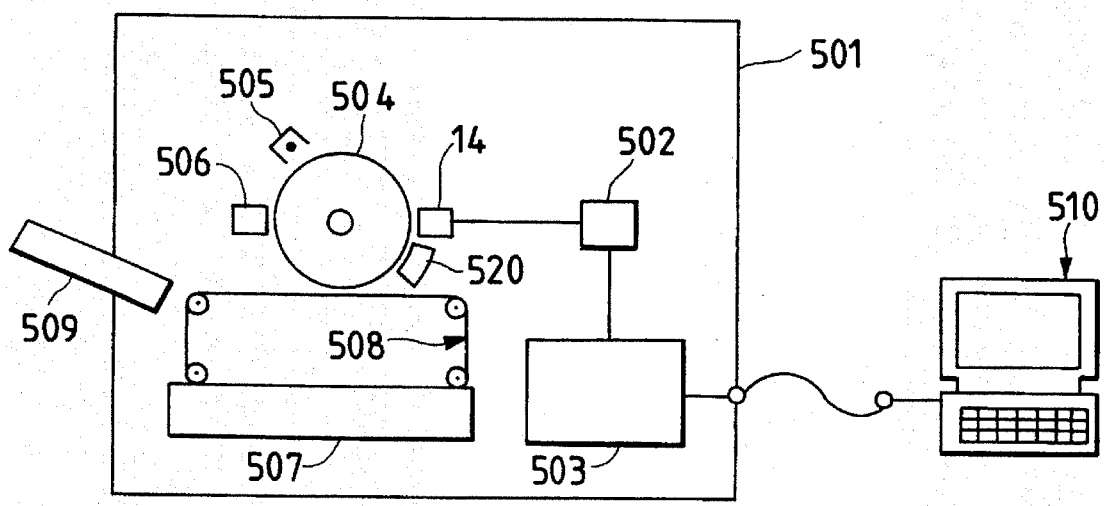
FIG. 28 is a model diagram showing a printer including the driver circuit according to the present invention.

FIG. 28 shows a laser printer 501 acting as a recording machine embodying the light emitting element driver circuit 502 according to the present invention.

The laser printer 501 includes an amorphous silicon photosensitive body 504, a charging device 505, transfer means 508, developing means 520, cleaning means 506 and a laser 14.

The signal processing circuit 503 processes the printing signal from the host computer 510 to send the outcome to the driver circuit 502.

The laser 14 is driven based on the printing signal to expose the photosensitive body 504. The developing device 520 develops a latent image with a toner. The toner is transferred on the surface of the recording medium on the belt acting as the transfer means 508. Numeral 507 represents a paper feed cassette and 509 represents a paper ejecting tray. The remaining toner is removed from the photosensitive body 504 with the cleaning means 506. The above steps are repeated.

According to the present invention, the fast rise time of output current from the laser enables a high speed exposure, thus providing an improved printing throughput.

A light emitting diode array may be substituted for the laser 14. The signal processing circuit 503 includes the memory mentioned above. The photoelectric converter device foregoing mentioned may be used as the laser light detector (not shown).

What is claimed is:

1. A driver circuit comprising;

a current mirror circuit provided with an output transistor having a main electrode connected to a load for supplying a driving current to the load;

a first switch connected to a control electrode of the output transistor, for turning on and for cutting off a current flowing into the output transistor; and a current source provided independently of the current mirror circuit, and having a second switch for supplying additional current to the output transistor in a turning on operation, wherein, synchronously with a turning on operation of the first switch, the second switch is turned on to supply the additional current to the output transistor through the current mirror circuit, the additional current being supplied to the control electrode of the output transistor by the current source.

2. A driver circuit according to claim 1, wherein the current mirror circuit comprises a pair of bipolar transistors, and a pair of MOS transistors.

3. A driver circuit according to claim 1, wherein the current source comprises a second current mirror circuit comprising PMOS transistors.

4. A driver circuit according to claim 1, wherein the current source comprises a second current mirror circuit comprising PNP transistors.

5. A driver circuit according to claim 1, wherein the current source comprises a second current mirror circuit having a pair of NPN transistors and a pair of PMOS transistors.

6. A driver circuit for driving a load device, said driver circuit comprising:

a current mirror circuit provided with an output transistor having a main electrode connected to the load device for supplying a driving current to the load device;

a first switch connected to a control electrode of the output transistor for turning on and for cutting off a current flowing into the output transistor; and a current source provided independently of the current mirror circuit, and having a second switch for supplying additional current to the output transistor in a turning on operation; wherein, synchronously with a turning on operation of the first switch, the second switch is turned on to supply the additional current to the output transistor through the current mirror circuit, the additional current being supplied to the control electrode of the output transistor by the current source.

7. A driver circuit according to claim 6, wherein the current mirror circuit comprises a pair of bipolar transistors and a pair of MOS transistors.

8. A driver circuit according to claim 6, wherein the current source comprises a second current mirror circuit of PMOS transistors.

9. A driver circuit according to claim 6, wherein the current source comprises a second current mirror circuit of PNP transistors.

10. A driver circuit according to claim 6, wherein having a pair of NPN transistors and a pair of PMOS transistors.

11. A recording apparatus comprising a photosensitive body, a charger for charging the photosensitive body, an exposing means for exposing the photosensitive body to light, and a developer, wherein the exposing means comprises:

a semiconductor light emitting element, a current mirror circuit comprising a main electrode connected to the semiconductor light emitting diode, and an output transistor for supplying a driving current to the semiconductor light emitting element;

a first switch connected to a control electrode of the output transistor, for turning on and for cutting off a current flowing into the output transistor; and a current source provided independently of the current mirror circuit, and having a second switch for supplying additional current to the output transistor in a turning on operation, wherein, synchronously with a turning on operation of the first switch, the second switch is turned on and the output transistor is supplied with the additional current through the current mirror circuit, the additional current being supplied to the control electrode of the output transistor by the current source.

* * * * *

UNITED STATES PATENT AND TRADEMARK OFFICE
CERTIFICATE OF CORRECTION

PATENT NO. : 5,514,989

DATED : May 7, 1996

INVENTOR(S): Toshiaki Sato, et al.

It is certified that error appears in the above-identified patent and that said Letters Patent is hereby corrected as shown below:

COLUMN 4

Line 45, " $I_{out}2$" should read -- $I_{out2}$--.

COLUMN 10

Line 17, "p $V_A=V_1-R_4 \cdot I_S$" should read -- $V_A=V_1-R_4 \cdot I_S$--.
　　　Line 52, "inverter $I_1$" should read --inverter I1--.

COLUMN 11

Line 28, "inverter $I_1$," should read --inverter I1,--.
　　　Line 34, "i s" should read --is--.

COLUMN 14

Line 21, "$I_L$+dark" should read -- $I_L$ + dark--.
　　　Line 64, "comprising;" should read --comprising:--.

COLUMN 15

Line 39, "operation; wherein" should read --operation, wherein--.

UNITED STATES PATENT AND TRADEMARK OFFICE
CERTIFICATE OF CORRECTION

PATENT NO. : 5,514,989

DATED : May 7, 1996

INVENTOR(S) : Toshiaki Sato, et al.

It is certified that error appears in the above-identified patent and that said Letters Patent is hereby corrected as shown below:

<u>COLUMN 16</u>

Line 14, "wherein having" should read --wherein the current source comprises a second mirror circuit having--.

Signed and Sealed this

Eighth Day of October, 1996

Attest:

BRUCE LEHMAN

Attesting Officer

Commissioner of Patents and Trademarks